(12) United States Patent
Tang et al.

(10) Patent No.: US 8,624,300 B2
(45) Date of Patent: Jan. 7, 2014

(54) CONTACT INTEGRATION FOR THREE-DIMENSIONAL STACKING SEMICONDUCTOR DEVICES

(75) Inventors: Sanh D. Tang, Boise, ID (US); John Zahurak, Eagle, ID (US); Shane Trapp, Boise, ID (US); Krishna K. Parat, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 256 days.

(21) Appl. No.: 12/969,975

(22) Filed: Dec. 16, 2010

(65) Prior Publication Data

US 2012/0153357 A1    Jun. 21, 2012

(51) Int. Cl.
*H01L 23/52*    (2006.01)
(52) U.S. Cl.
USPC ............ 257/211; 257/E23.173; 257/E21.602; 438/129
(58) Field of Classification Search
USPC ............ 257/211, E23.173, E21.602; 438/129
See application file for complete search history.

(56) References Cited

U.S. PATENT DOCUMENTS

| | | | |
|---|---|---|---|
| 4,435,896 A | 3/1984 | Parrillo et al. | |
| 7,589,375 B2 * | 9/2009 | Jang et al. | 257/316 |
| 7,683,404 B2 * | 3/2010 | Jang et al. | 257/211 |
| 8,222,742 B2 * | 7/2012 | Cho et al. | 257/773 |
| 2008/0119020 A1 | 5/2008 | Grisham et al. | |
| 2009/0207649 A1 | 8/2009 | Tang et al. | |
| 2010/0230724 A1 | 9/2010 | Sinha et al. | |
| 2011/0084314 A1 * | 4/2011 | Or-Bach et al. | 257/209 |

OTHER PUBLICATIONS

Lee et al., "Stack Friendly All-Oxide 3D RRAM using GaInZnO Peripheral TFT realized over Glass Substrates", Electron Devices Meeting, IEEE International, Dec. 2008, pp. 85-88.
Park et al., "A Fully Performance Compatible 45 nm 4-Gigabit Three Dimensional Double-Stacked Multi-Level NAND Flash Memory with Shared Bit-Line Structure", IEEE Journal of Solid-State Circuits, vol. 44, No. 1, Jan. 2009, pp. 208-216.

* cited by examiner

*Primary Examiner* — David Vu
*Assistant Examiner* — Brandon Fox
(74) *Attorney, Agent, or Firm* — Cool Patent, P. C.

(57) ABSTRACT

Briefly, in accordance with one or more embodiments, multilayer memory device, comprising a lower deck and an upper deck disposed on the lower deck, the decks comprising one or more memory cells coupled via one or more contacts. An isolation layer is disposed between the upper deck, and one or more contacts are formed between the upper deck and the lower deck to couple one or more of the contact lines of the upper deck with one or more contact lines of the lower deck.

12 Claims, 17 Drawing Sheets

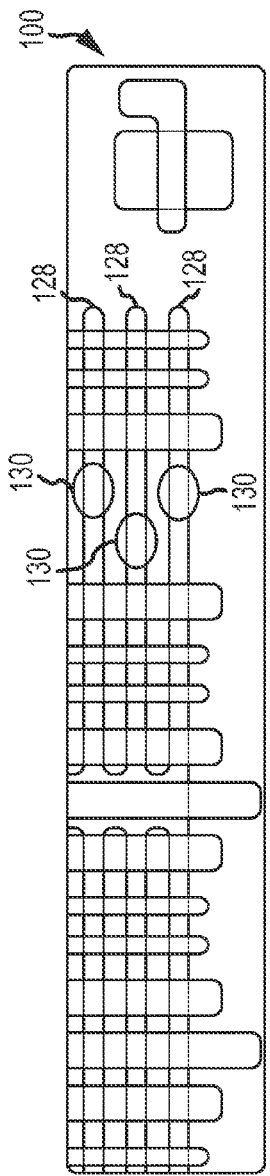
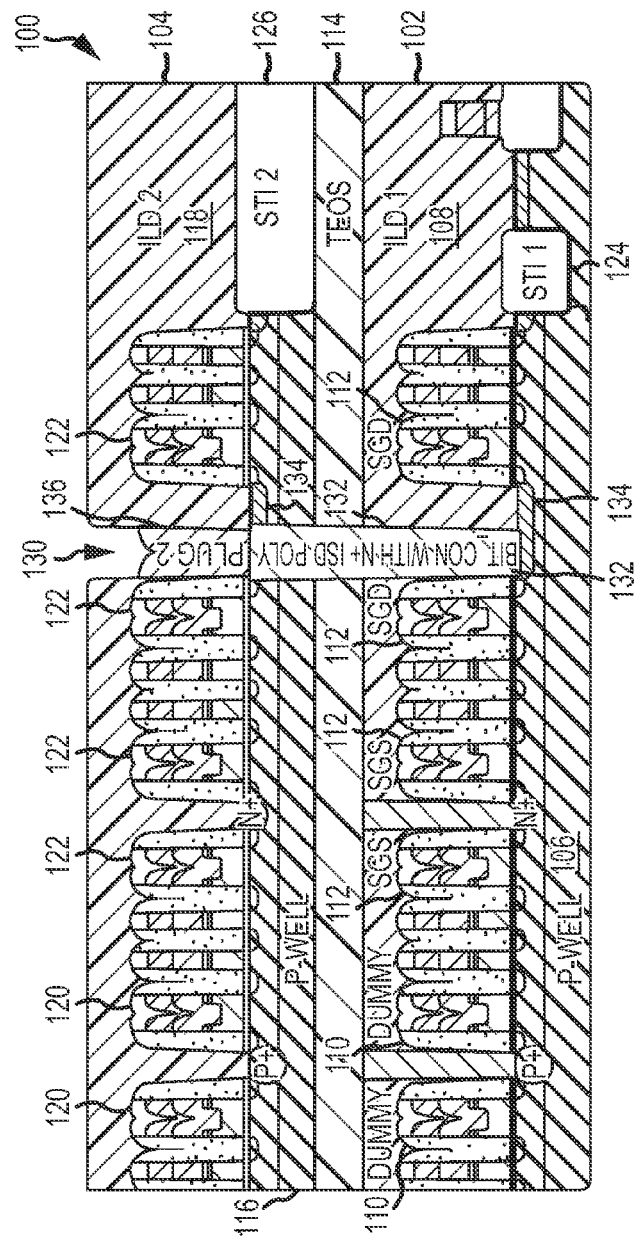
FIG. 1A
FIG. 1B

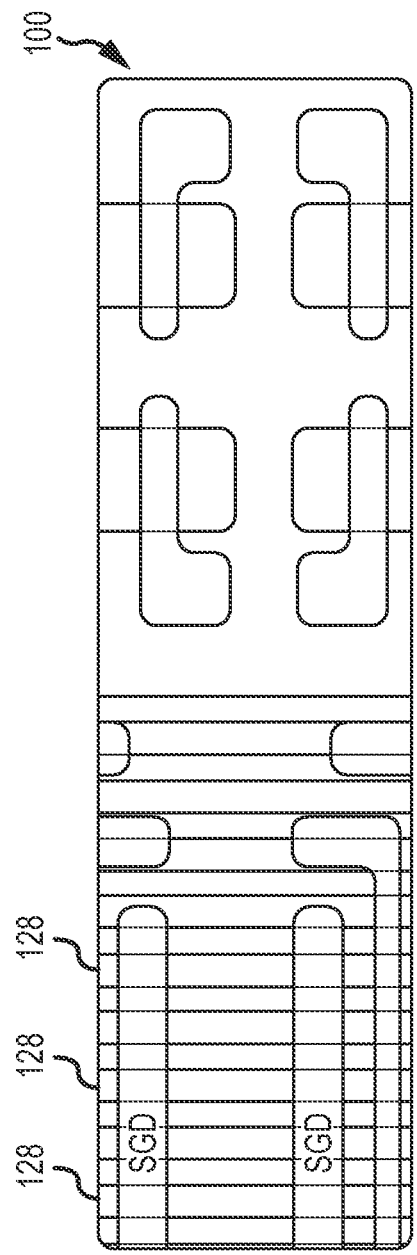
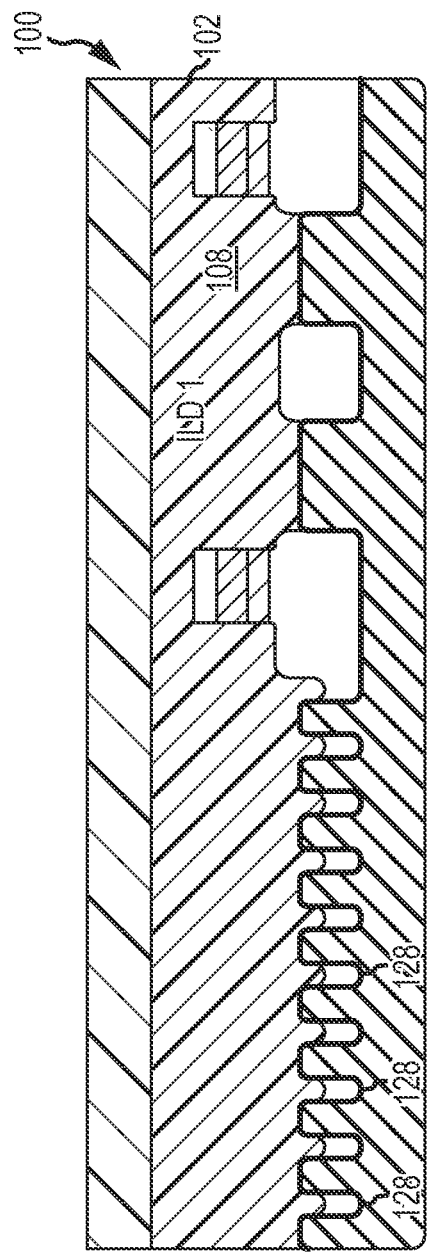
FIG. 10A
FIG. 10B

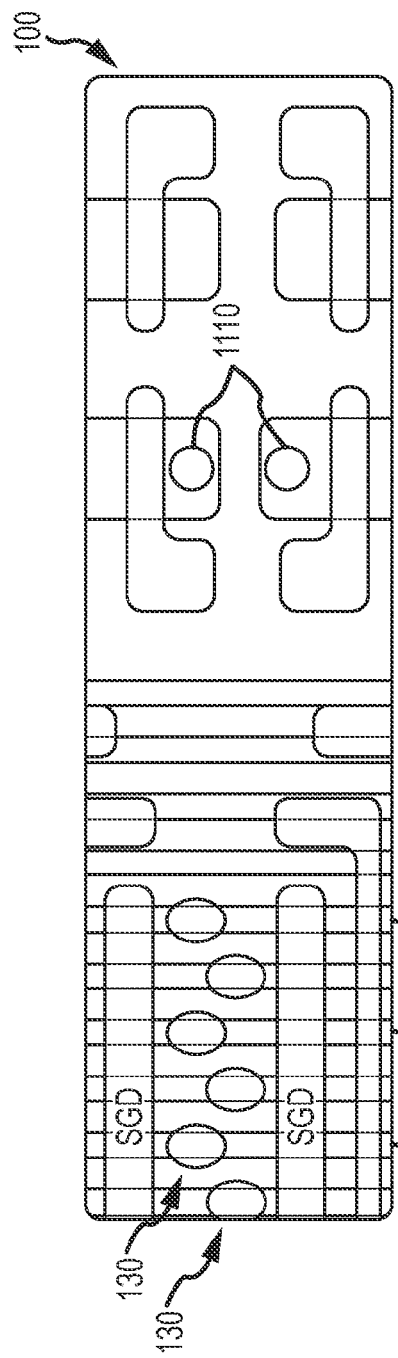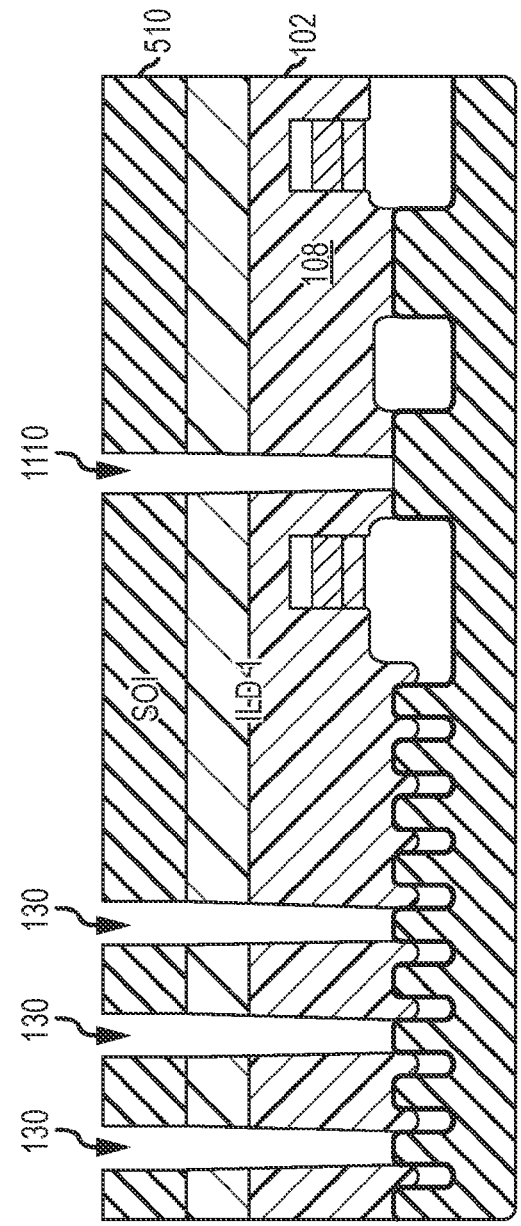

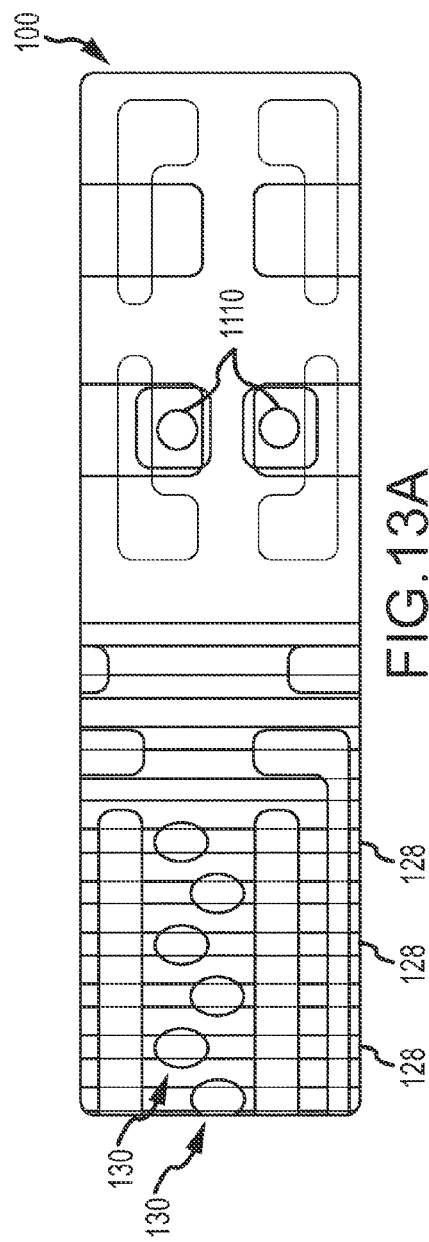
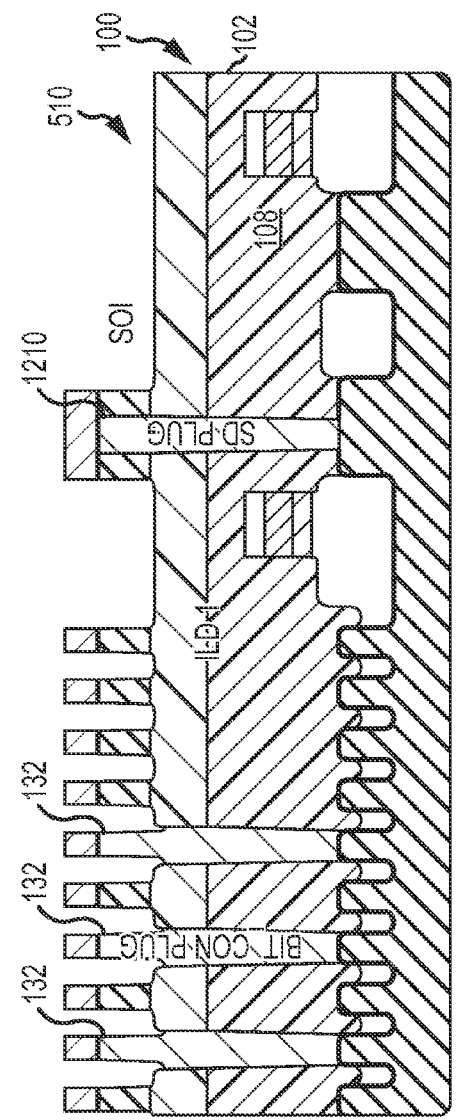
FIG. 13A
FIG. 13B

CONTACT INTEGRATION FOR THREE-DIMENSIONAL STACKING SEMICONDUCTOR DEVICES

BACKGROUND INFORMATION

As semiconductor devices approach limits for scaling, pitch doubling and three-dimensional stacking have been considered as alternative techniques to increase device density and lower costs. While lithography limitations may be addressed via pitch doubling either by using a spacer hard mask or double patterning, contacting the less than nominal pitch features between devices at three-dimensional layers may be challenging due to critical dimension and alignment constraints.

DESCRIPTION OF THE DRAWING FIGURES

Claimed subject matter is particularly pointed out and distinctly claimed in the concluding portion of the specification. However, such subject matter may be understood by reference to the following detailed description when read with the accompanying drawings in which:

FIG. 1A and FIG. 1B are top view and side view diagrams, respectively, of a multiple layer semiconductor device showing the integration of a nominal pitch contact to connect less than nominal or nominal pitch features from multiple vertical stacking tiers in accordance with one or more embodiments;

Figure 15:
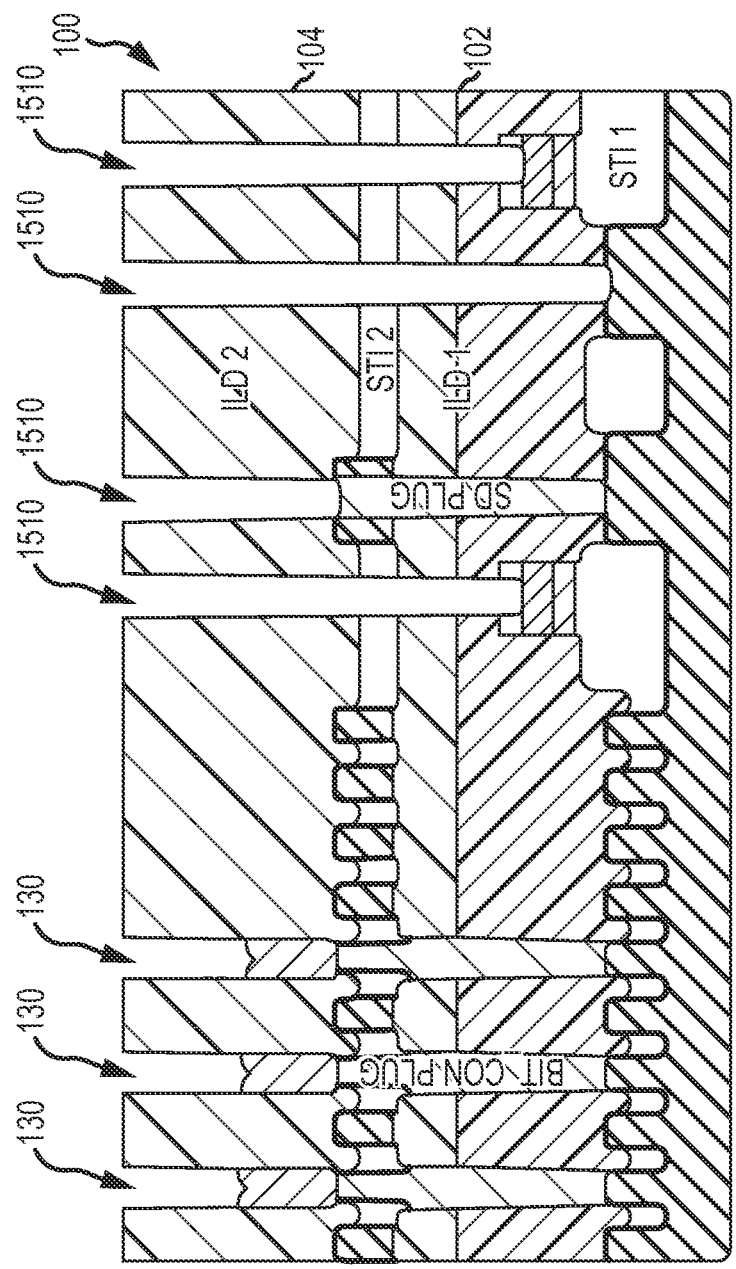
Figure 16:
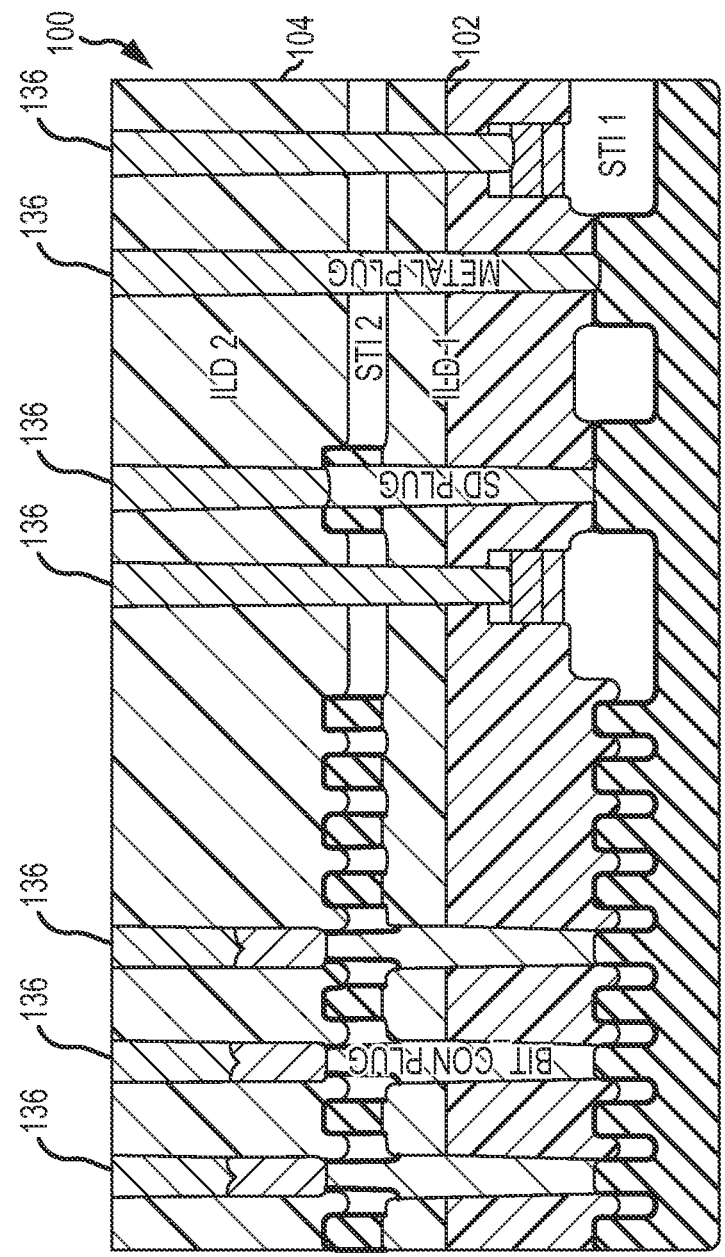
Figure 17:
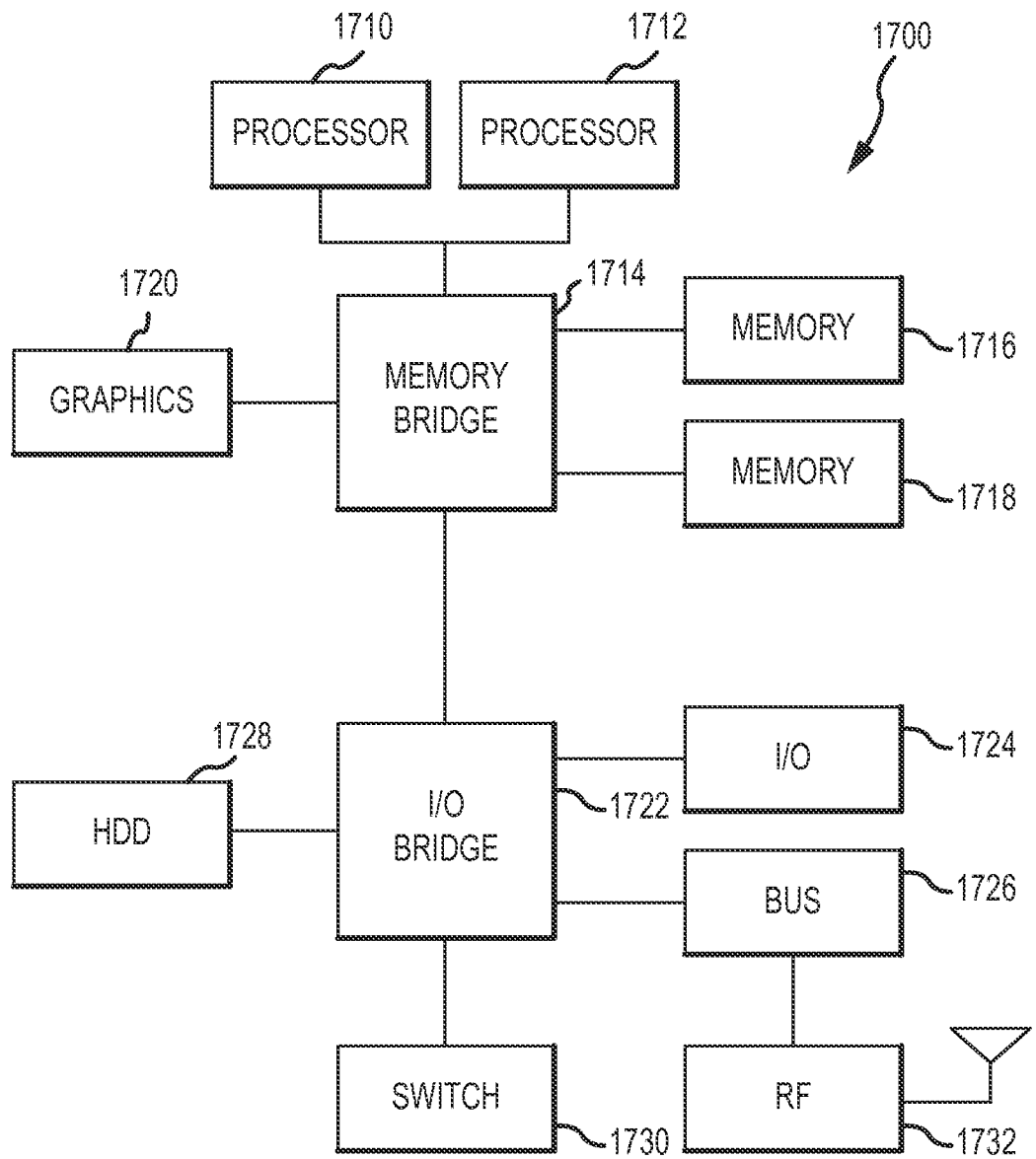

FIG. 10A and FIG. 10B through FIG. 16 are diagrams of a multiple layer semiconductor device showing the fabrication process of FIG. 1A and FIG. 1B through FIG. 9A and FIG. 9B at a 90 degree rotation in accordance with one or more embodiments; and FIG. 17 is a block diagram of an information handling system capable of utilizing three-dimensional stacked semiconductor device in accordance with one or more embodiments.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail.

In the following description and/or claims, the terms coupled and/or connected, along with their derivatives, may be used. In particular embodiments, connected may be used to indicate that two or more elements are in direct physical and/or electrical contact with each other. Coupled may mean that two or more elements are in direct physical and/or electrical contact. However, coupled may also mean that two or more elements may not be in direct contact with each other, but yet may still cooperate and/or interact with each other. For example, "coupled" may mean that two or more elements do not contact each other but are indirectly joined together via another element or intermediate elements. Finally, the terms "on," "overlying," and "over" may be used in the following description and claims. "On," "overlying," and "over" may be used to indicate that two or more elements are in direct physical contact with each other. However, "over" may also mean that two or more elements are not in direct contact with each other. For example, "over" may mean that one element is above another element but not contact each other and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect. In the following description and/or claims, the terms "comprise" and "include," along with their derivatives, may be used and are intended as synonyms for each other.

Referring now to FIG. 1A and FIG. 1B, top view and side view diagrams, respectively, of a multiple layer semiconductor device 100 showing the integration of a nominal pitch contact 132 to connect less than nominal or nominal pitch features from multiple vertical stacking tiers in accordance with one or more embodiments. In one or more embodiments, a semiconductor device 100 may comprise multiple layers such as a first active layer 102 and a second active layer 104. A top view of semiconductor device 100 is shown in FIG. 1 in which the second active layer 104 is visible. As shown in FIG. 1B in the side view of semiconductor device 100, first active layer 102 may be formed using a first p-well layer 106 and a first interlayer dielectric 108 in which multiple devices may be formed such as dummy gates 110 in a contact region (P+) of first p-well layer 106 and one or more transistors 112 labeled as select-gate-source (SGS) or select-gate-drain (SGD). In other embodiments, the active layers 102/104 may comprise alternate and/or additional dopant regions and types known to one skilled in the art. The first active layer 102 also comprises contact features 134 such as a source, a drain, a gate, and a wordline. A first shallow trench isolation (STI 1) 124 may be disposed between first interlayer dielectric 108 and first p-well layer 106, and an intermediate layer 114 may be formed, for example via a tetraethyl orthosilicate (TEOS) process to provide one or more silicon dioxide ($SiO_2$) layer, between first active layer 102 and second active layer 104. Likewise, second active layer 104 may comprise a second p-well layer 116, a second interlayer dielectric (ILD 2) 118, dummy gates 120 in the contact region of the second p-well layer 116, one or more transistors 122, and/or a second shallow trench isolation (STI 2) 126. The second active layer 104 also comprises contact features 134 such as a source, a drain, a gate, and a wordline.

As shown in the top view of semiconductor device 100 shown in FIG. 1A, lines 128 are less than nominal pitch features of second active layer 104. One or more openings 130 are formed through second active layer 104 and first active layer 102 wherein openings 130 reveal underlying features that may include less than nominal pitch lines 128. Openings 130 may comprise contacts 132, such as in-situ doped (ISD) plugs positioned on or over a contact feature 134.

Although FIG. 1A and FIG. 1B illustrate an embodiment of the semiconductor device 100 having two layers comprising first active layer 102 and second active layer 104, it should be noted that the structure of semiconductor device 100 may be extrapolated via the fabrication process described in further detail, below, by forming additional decks on second active layer 104 in a manner substantially similar to the formation of second active layer 104 on first active layer 102. For a top deck of a multilayer device, a plug 136 may be formed in openings 130, otherwise, additional contacts 132 may be formed in openings 130 for successive decks. The semiconductor device 100 may comprise several types of memory architectures, for example flash, dynamic random access memory (DRAM), imagers, phase-change random access memory (PCRAM), resistive random access memory (RRAM), zero capacitor random access memory (ZRAM), one-time programmable random access memory (OTPRAM), and/or advanced static random access memory (SRAM), and so on, and the scope of the claimed subject matter is not limited in this respect. The fabrication process and the resulting structure for forming a semiconductor device 100 having multiple layers is discussed in detail, below, starting with FIG. 2A and FIG. 2B.

Figure 2A:
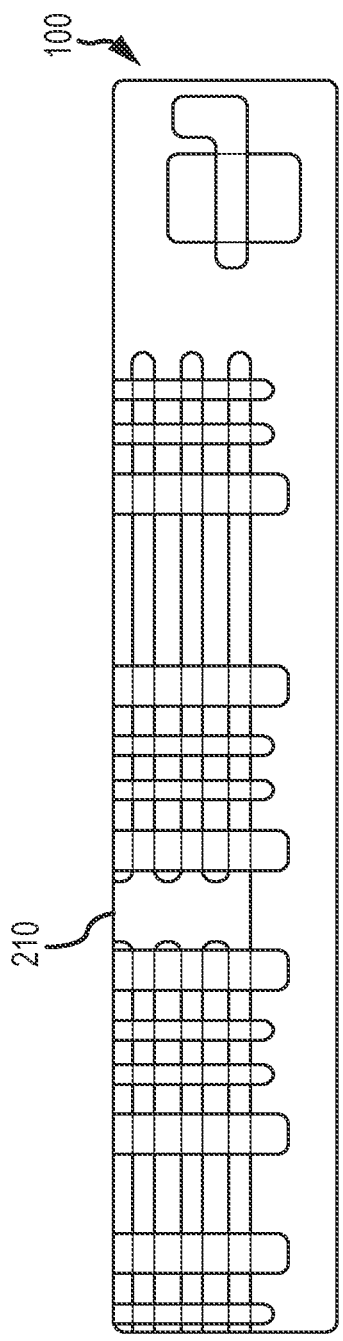
FIG. 2A and FIG. 2B are top view and side view diagrams, respectively, of a lower deck of a multiple layer semiconductor device showing a lower interconnect feature in accordance with one or more embodiments.
Figure 2B:
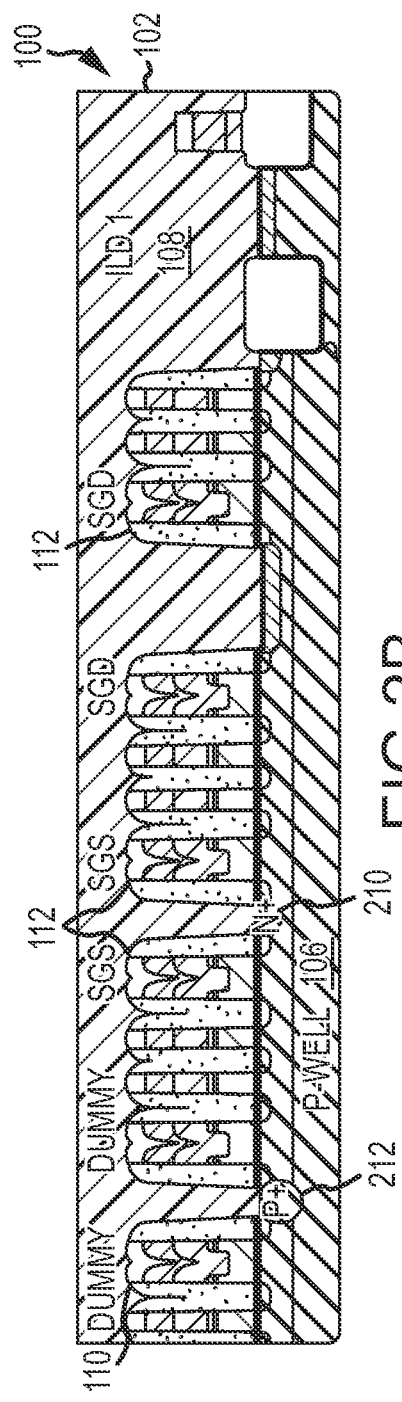

Referring now to FIG. 2A and FIG. 2B, top view and side view diagrams, respectively, of a lower deck of a multiple layer semiconductor device illustrating a lower interconnect feature in accordance with one or more embodiments. For an earlier stage in the fabrication of semiconductor device 100, one or more dummy gates 110 may be formed in the first p-well layer 106. One or more transistors 112 may be formed in first interlayer dielectric 108 and coupled via common source (CS) contacts (N+) 210 and/or P-tub contacts (P+) 212. In some embodiments a high aspect ratio process (HARP) may be use to fill gaps. Furthermore, a chemical mechanical planarization (CMP) may be utilized to polish the first interlayer dielectric 108 to a target thickness, for example to about 3 kilo angstroms (kÅ), although the scope of the claimed subject matter is not limited in this respect.

Figure 3A:
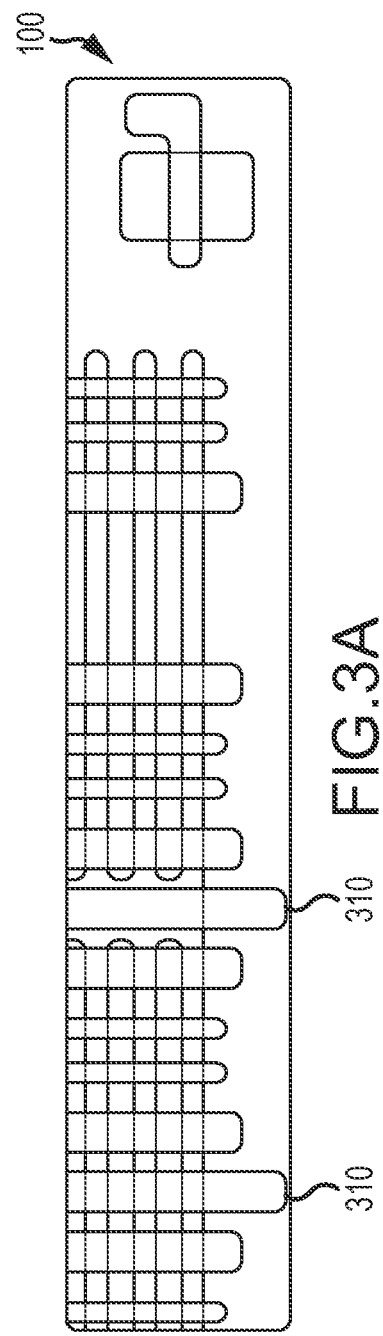
FIG. 3A and FIG. 3B are top view and side view diagrams, respectively, of a lower deck of a multiple layer semiconductor device showing lower deck contacts and a local interconnect in accordance with one or more embodiments.
Figure 3B:
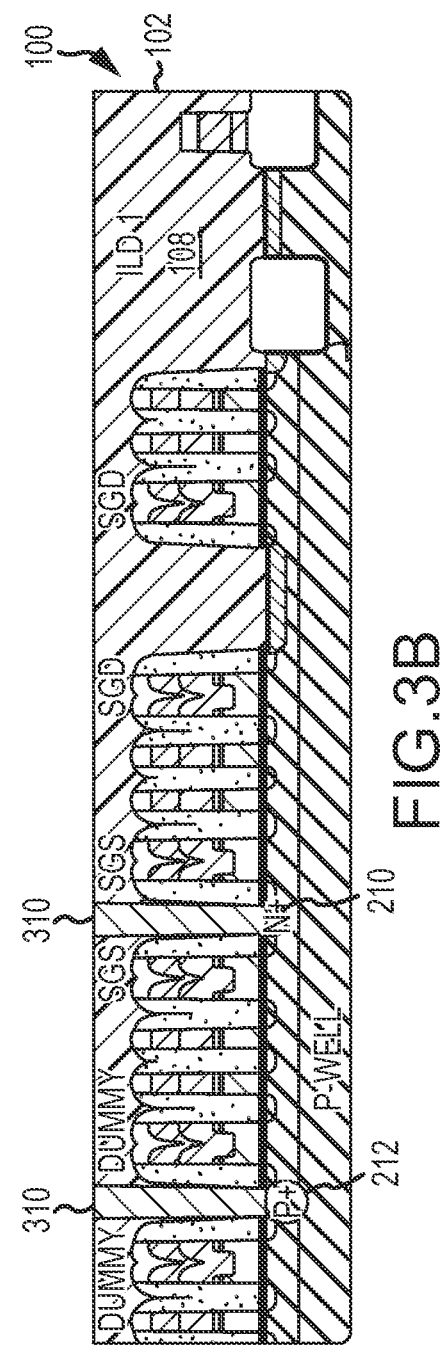

Referring now to FIG. 3A and FIG. 3B, top view and side view diagrams, respectively, of a lower deck of a multiple layer semiconductor device showing lower deck contacts and a local interconnect in accordance with one or more embodiments will be discussed. The contact slots 310 for common source contacts 210 and/or P-tub contacts 212 may be formed in the first interlayer dielectric 108 and plugged with tungsten (W) plugs in one or more embodiments. Then a post tungsten chemical mechanical planarization (CMP) process may be performed to smooth the surface of the first interlayer dielectric 108 to a thickness of about 2.5 kÅ to about 3.0 kÅ, although the scope of the claimed subject matter is not limited in this respect.

Figure 4A:
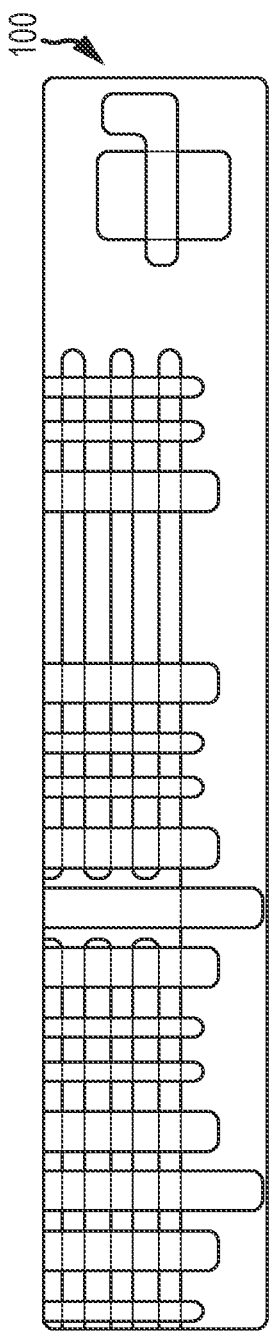
FIG. 4A and FIG. 4B are top view and side view diagrams, respectively, of a lower deck of a multiple layer semiconductor device showing an interlayer dielectric in accordance with one or more embodiments.
Figure 4B:
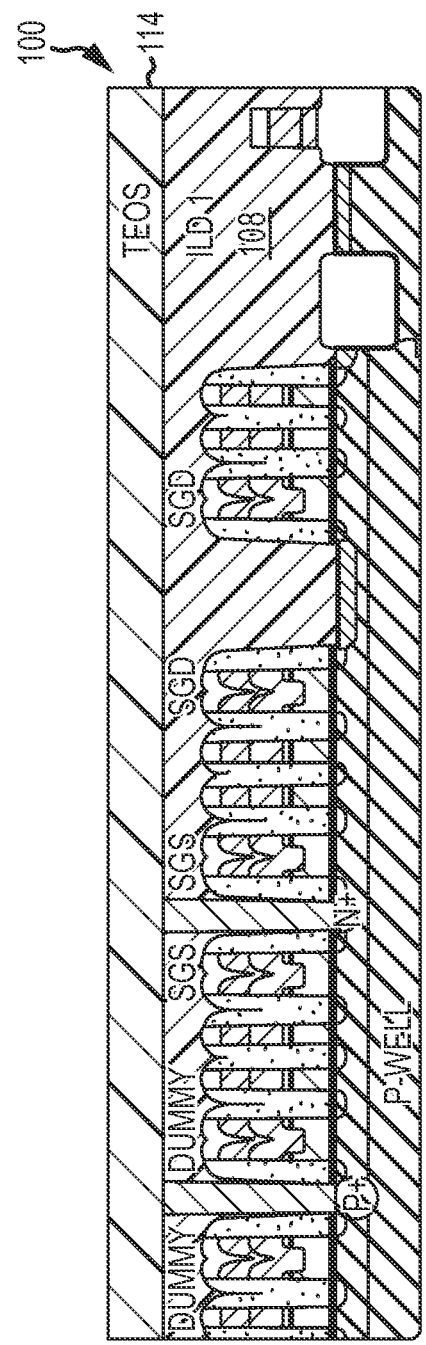

Referring now to FIG. 4A and FIG. 4B, top view and side view diagrams, respectively, of a lower deck of a multiple layer semiconductor device showing an interlayer dielectric in accordance with one or more embodiments. As shown, the intermediate layer 114 may be formed, for example via a tetraethyl orthosilicate (TEOS) process, on the first interlayer dielectric 108. The intermediate layer 114 may be considered as an isolation layer that functions to isolate the common source contacts 210 and/or P-tub contacts 212 from the second active layer 104 that will be subsequently disposed on first active layer 102. In one or more embodiments, a target thickness for the intermediate layer 114 is about 2.5 kÅ and the intermediate layer 114 may be formed of one or more layers in a layer stack, although the scope of the claimed subject matter is not limited in this respect. The interlayer dielectric layers may be planarized, polished, etched, or otherwise eroded using a process such as chemical mechanical planarization (CMP). The planarization process erodes a top portion of the intermediate layer 114 to create a uniform surface while improving the optical resolution of subsequent lithography steps.

Figure 5A:
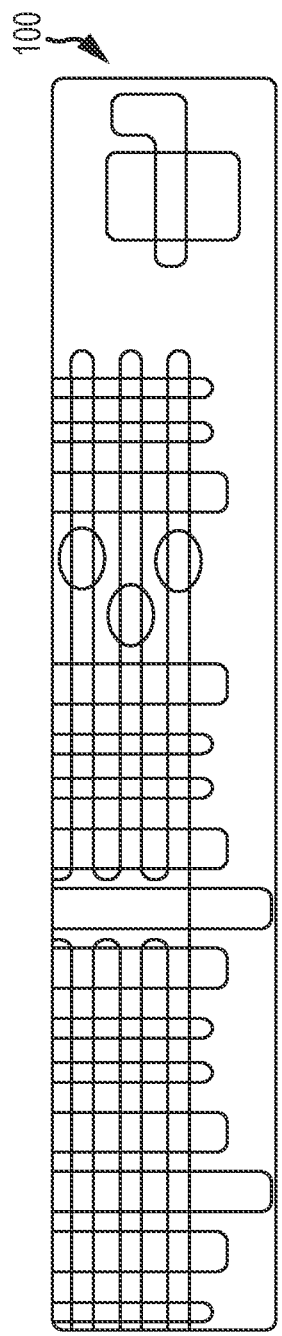
FIG. 5A and FIG. 5B are top view and side view diagrams, respectively, of a lower deck of a multiple layer semiconductor device showing a silicon on insulator (SOI) layer in accordance with one or more embodiments.
Figure 5B:
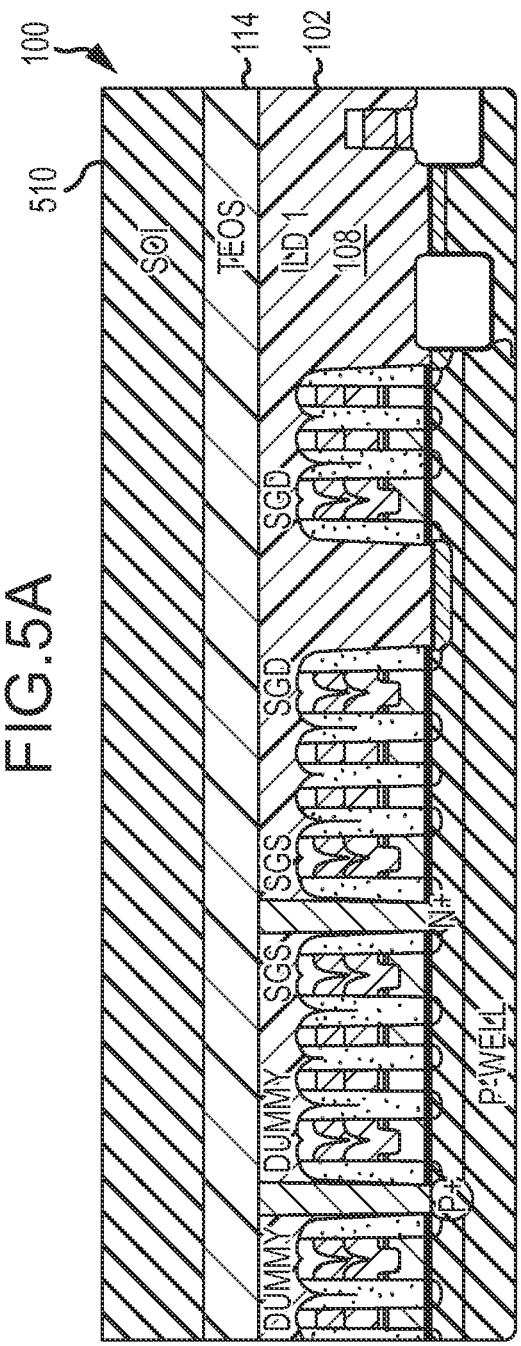

Referring now to FIG. 5A and FIG. 5B, top view and side view diagrams, respectively, of a lower deck of a multiple layer semiconductor device 100 showing an upper layer 510, such as a silicon on insulator (SOI) layer, in accordance with one or more embodiments. The upper layer 510, which may be a SOI layer, may be disposed on top of the intermediate layer 114 to function as the substrate for the second active layer 104. One or more additional layers may be disposed on the intermediate layer 114 in other embodiments. In one or more embodiments, upper layer 510 may be formed to a target thickness of about 3 kÅ. The upper layer 510 may be formed of a crystalline, poly-crystalline, or an amorphous material that is formed or positioned on the intermediate layer 114 and wherein the upper layer 510 is devoid of active devices. In one embodiment, the upper layer 510 is provided on the intermediate layer 114 using a wafer bonding process to deposit a silicon layer on the intermediate layer 114.

Figure 6A:
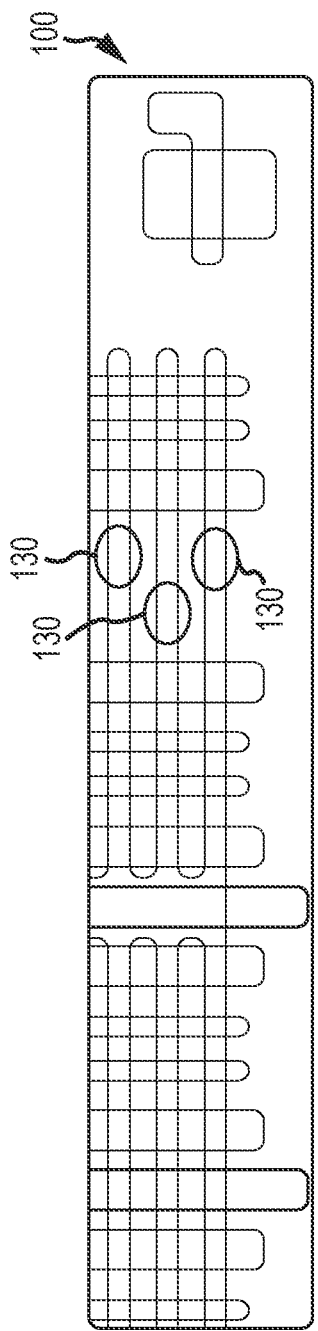
FIG. 6A and FIG. 6B are top view and side view diagrams, respectively, of a lower deck of a multiple layer semiconductor device showing an opening through the SOI layer in accordance with one or more embodiments.
Figure 6B:
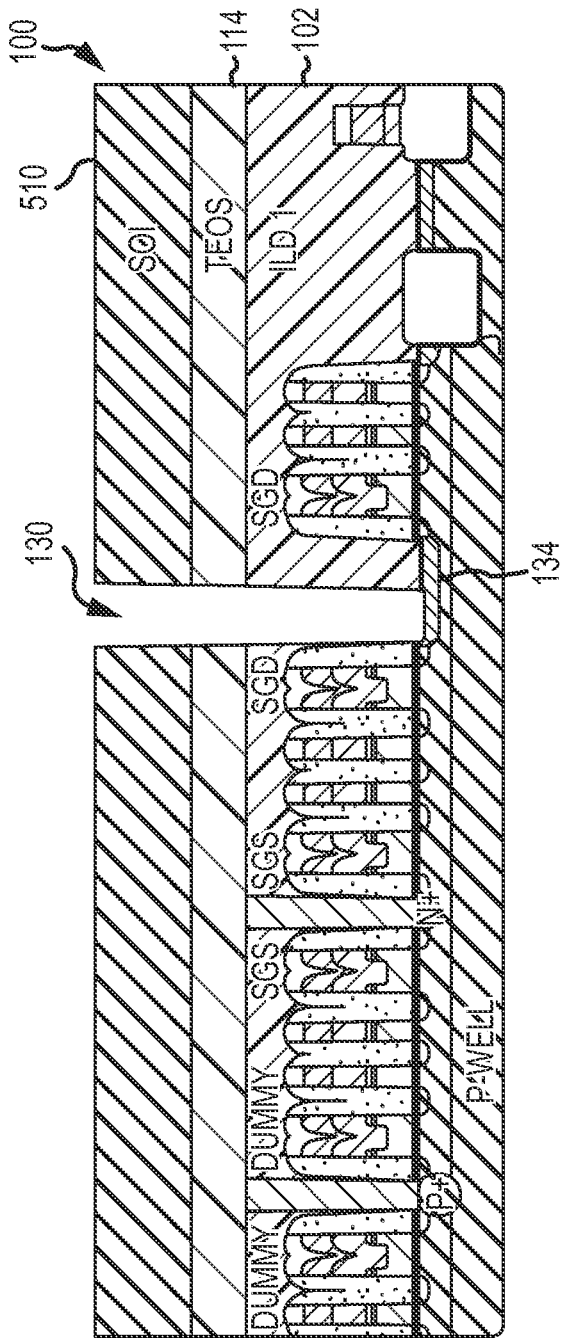

Referring now to FIG. 6A and FIG. 6B, top view and side view diagrams, respectively, of a lower deck of a multiple layer semiconductor device showing an opening through the upper layer 510, the intermediate layer 114, and the first interlayer dielectric 108 in accordance with one or more embodiments. At this stage, the opening 130 is formed through upper layer 510 through to the contact feature 134, which in one or more embodiments may be a source, a drain, a gate, a wordline, and a bitline though the embodiments are not so limited.

Figure 7A:
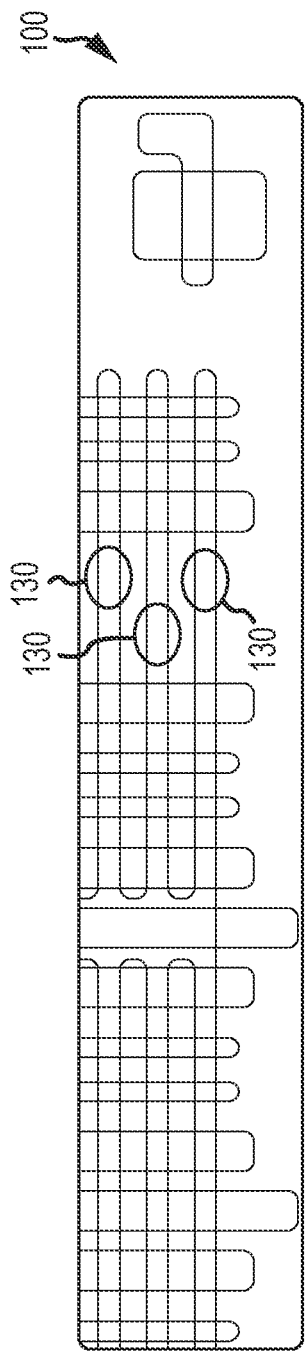
FIG. 7A and FIG. 7B are top view and side view diagrams, respectively, of a lower deck of a multiple layer semiconductor device showing an interlayer contact in accordance with one or more embodiments.
Figure 7B:
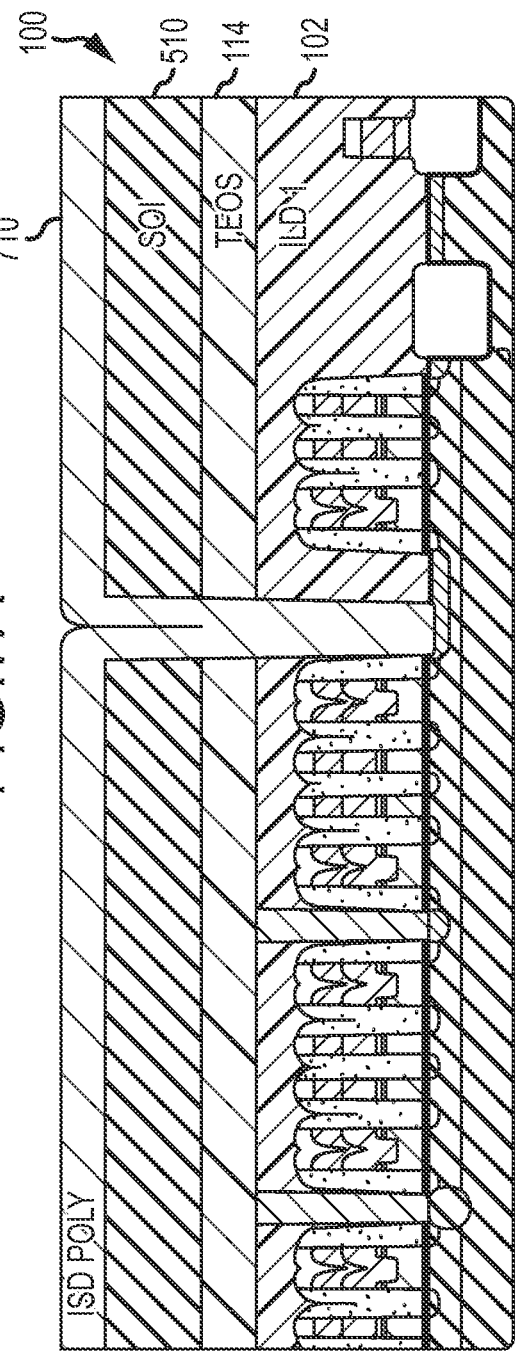

Referring now to FIG. 7A and FIG. 7B, top view and side view diagrams, respectively, of a lower deck of a multiple layer semiconductor device showing a contact forming layer 710 in accordance with one or more embodiments. The contact forming layer 710 may be formed comprising a metal or polysilicon material such as in-situ doped (ISD) polysilicon to fill the openings 130 between first active layer 102 and the upper layer 510. In one or more embodiments, a target thickness for the contact forming layer 710 may be established in response to a size of the opening 130, wherein the contact forming layer 710 fills or substantially fills the opening 130 at least to a top surface of the upper layer 720. In an embodiment wherein a lower bit contact 132 is provided, a higher doped polysilicon may be utilized. The thickness of the polysilicon may be minimized or otherwise kept relatively low to facilitate planarization, erosion, or etching of the contact forming layer 710. Alternatively, the thickness of the polysilicon may be increased if desired to fill the gaps in openings 130, although the scope of the claimed subject matter is not limited in this respect. The contact forming layer may be formed using one or more forms of chemical vapor deposition (CVD), physical vapor deposition (PVD), atomic layer deposition (ALD), spin-on deposition, electrochemical deposition, or some other form of deposition. In another embodiment, the contact forming layer 710 may be formed using bottom-up electroless deposition.

Figure 8A:
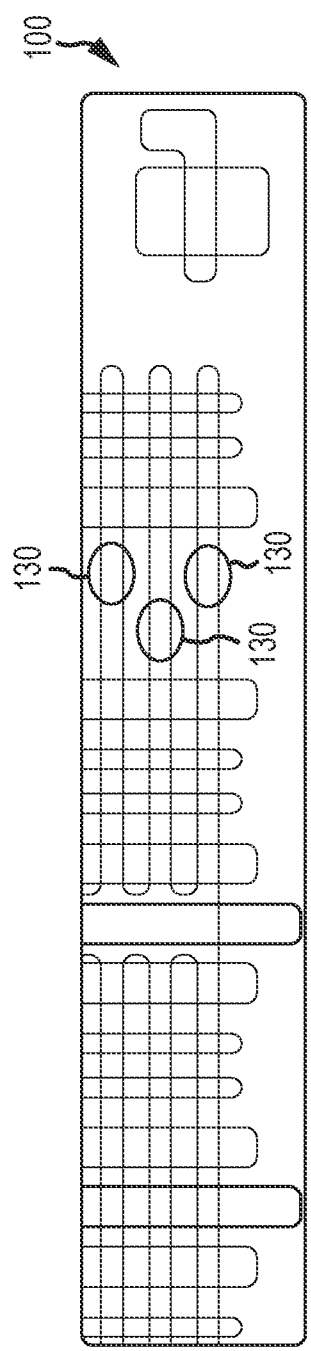
FIG. 8A and FIG. 8B are top view and side view diagrams, respectively, of a lower deck of a multiple layer semiconductor device showing finalization of the contact in accordance with one or more embodiments.
Figure 8B:
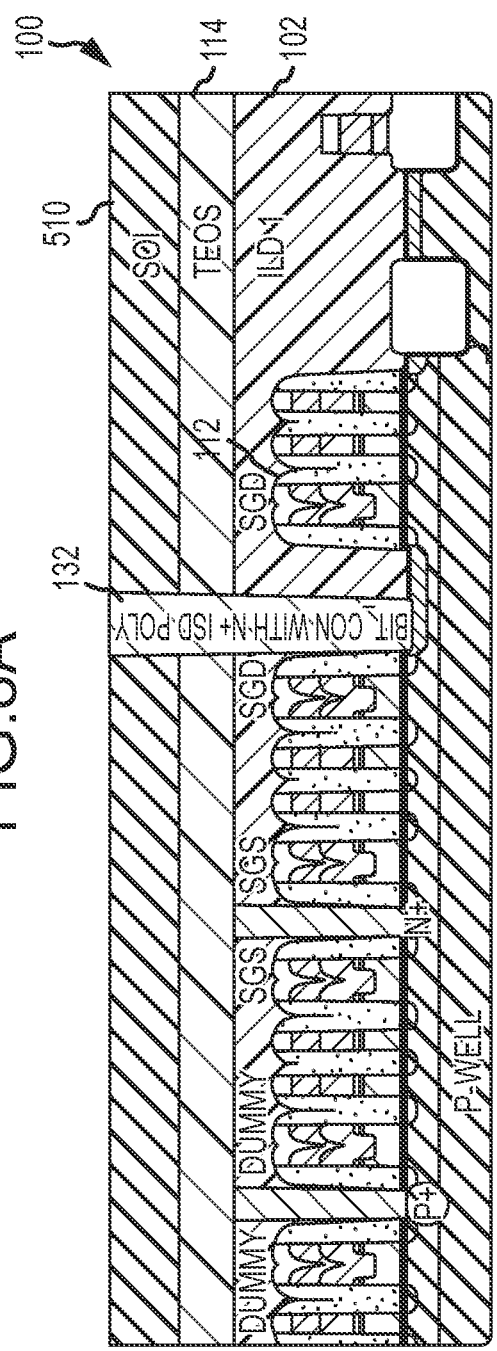

Referring now to FIG. 8A and FIG. 8B, top view and side view diagrams, respectively, of a lower deck of a multiple layer semiconductor device 100 showing formation of the contact 132 in accordance with one or more embodiments. The contact 132 may be formed via a polishing process, for example using chemical mechanical planarization (CMP) to remove the polysilicon and further to thin down the upper layer 510 to a thickness of about 1.5 kÅ to about 2.0 kÅ. The surface of upper layer 510 is then ready for the formation and integration of the second active layer 104 on the first active layer 102.

Figure 9A:
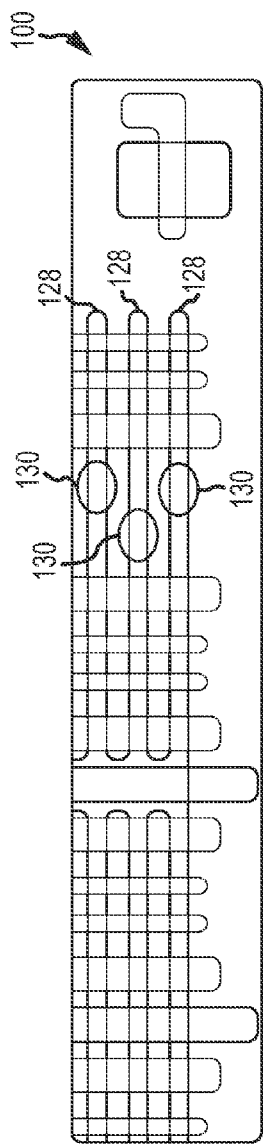
FIG. 9A and FIG. 9B are top view and side view diagrams, respectively, of a multiple layer semiconductor device showing integration of an upper deck with a lower deck in accordance with one or more embodiments.
Figure 9B:
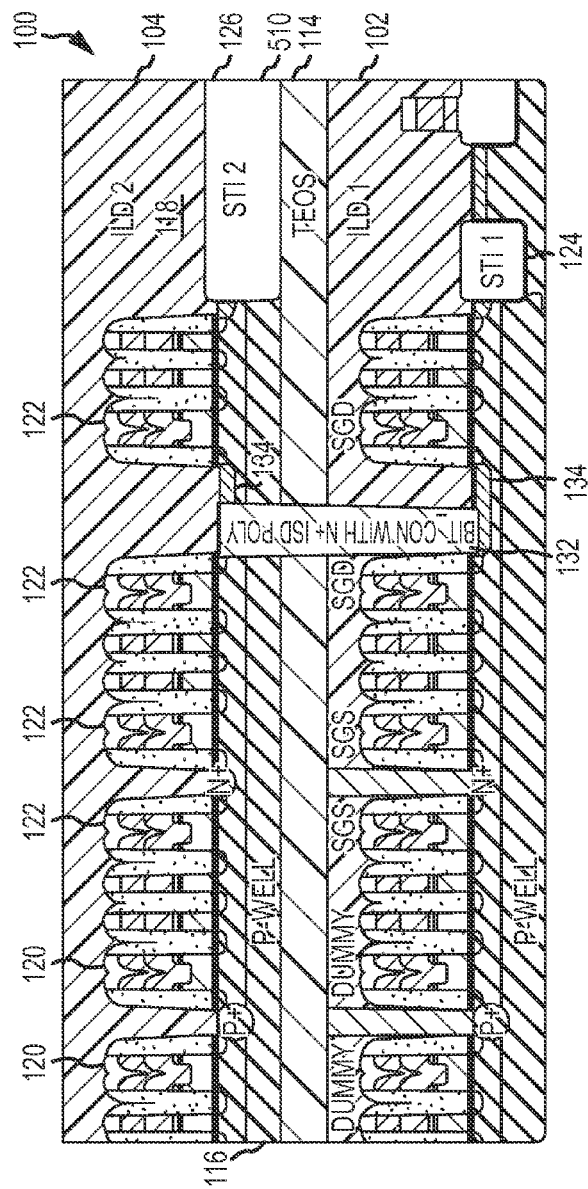
Figure 12A:
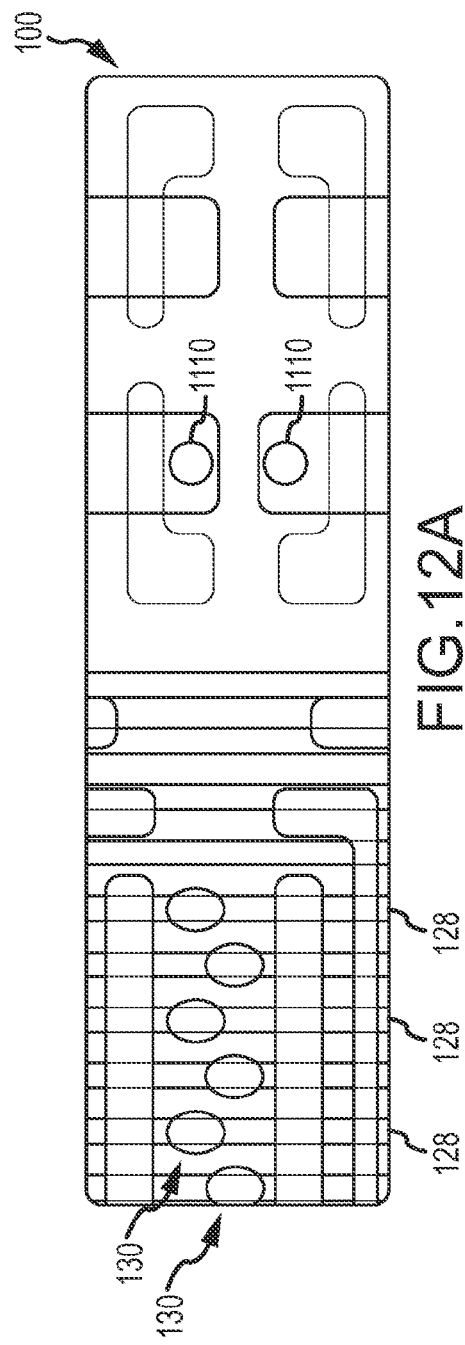
Figure 12B:
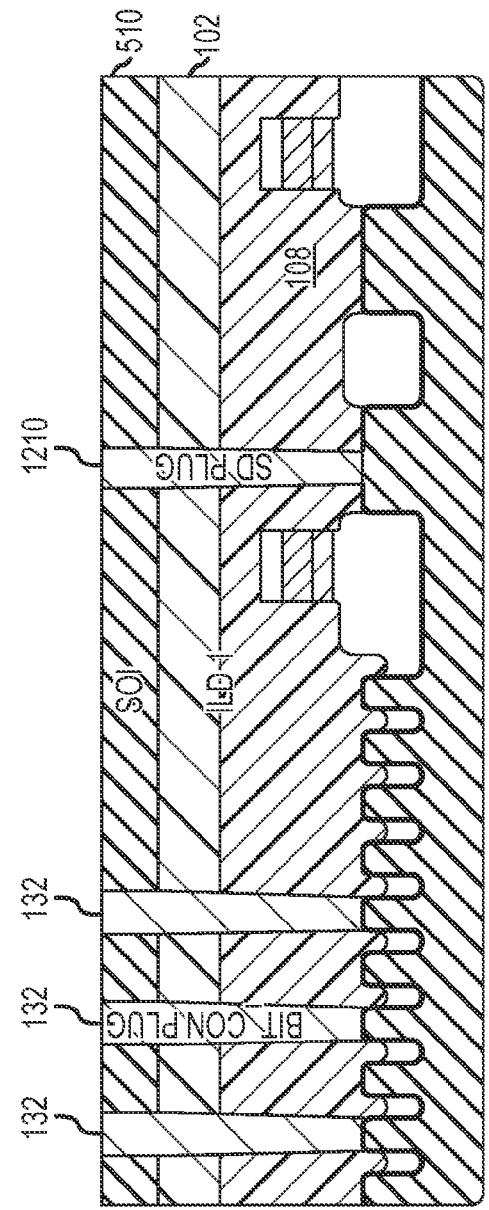

Referring now to FIG. 9A and FIG. 9B, top view and side view diagrams, respectively, of a multiple layer semiconductor device 100 illustrating integration of an upper deck with a lower deck in accordance with one or more embodiments. As shown in FIG. 9A and FIG. 9B, second active layer 104 may be built on and comprise portions of upper layer 510 to form a second p-well layer 116, dummy gates 120 and transistors 122, second shallow trench isolation (STI2) 126 and the second interlayer dielectric 118. The structures found in the second active layer 104 may be similar to structures formed in the first active layer 102. Formation of the STI 2 126 may be used to isolate one or more of the contacts 132. As shown in FIG. 9A, the lines 128 running from left to right may be less than nominal pitch features that are coupled to full pitch feature openings 130. In general, the process shown in FIG. 1A and FIG. 1B through FIG. 9A and FIG. 9B may be used to integrate one or more nominal pitch contacts to connect to less than nominal pitch and/or nominal pitch features from multiple vertical stacking tiers comprising first active layer 102 and second active layer 104 and/or further additional decks built in the same manner as second active layer 104 on first active layer 102. To form further decks beyond the two decks shown, the process shown in FIG. 4A and FIG. 4B through FIG. 8A and FIG. 8B may be repeated for each additional deck to be formed for multilayer semiconductor device 100, although the scope of the claimed subject matter is not limited in this respect.

FIG. 10A and FIG. 10B through FIG. 16 are diagrams of a multiple layer semiconductor device 100 showing the fabrication process of FIG. 1A and FIG. 1B through FIG. 9A and FIG. 9B at a 90 degree rotation in accordance with one or more embodiments. FIG. 11A and FIG. 11B illustrates the openings 130 etched through the upper layer 510, the intermediate layer 114, and the first interlayer dielectric 108 down to the contact feature 134 of the first active layer 102 wherein the openings 130 are aligned to the less than nominal pitch lines 128 in the first active layer. Source-drain (SD) contact opening 1110 also may be etched down to the source-drain contract region of the first p-well layer 106. FIG. 12A and FIG. 12B show the interlayer contacts through upper layer 510, the intermediate layer 114 and the first interlayer dielectric 108, which may be contacts 132 such as a bit contact (Bit_con) and/or source-drain (SD) contacts 1210 in openings 130 and 1110. The contacts 132 and SD contact 1210 may be formed by depositing contain in-situ doped (ISD) polysilicon to fill the openings 130 and SD opening 1110, and chemical mechanical planarization (CMP) may be performed to remove the excess ISD polysilicon and to planarize the upper layer 510, although the scope of the claimed subject matter is not limited in this respect.

Figure 14:
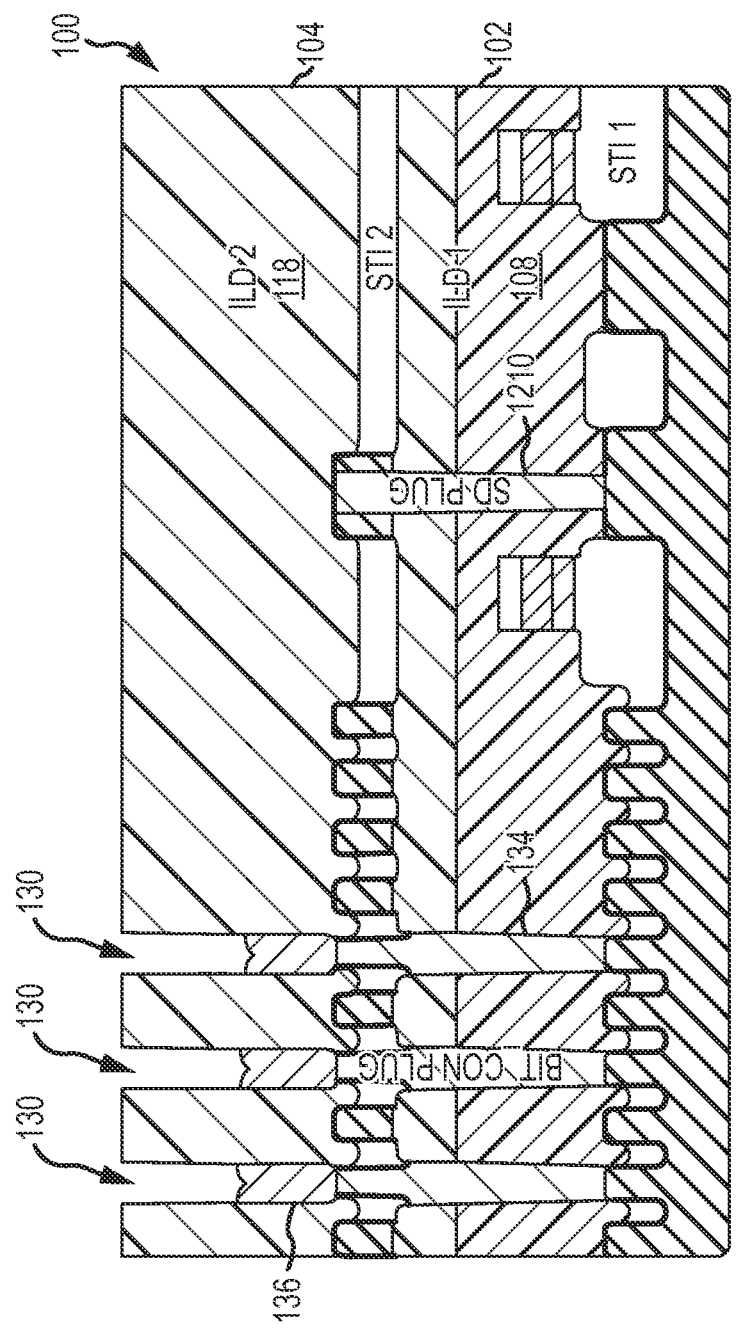

FIG. 13A and FIG. 13B illustrate how the lines 128 on the top surface of upper layer 510 are less than nominal pitch feature size lines, whereas the contacts 132 in first active layer 102 are nominal feature size. The contacts 132 are covered with etch masks for the formation of subsequent contacts when the remainder of second active layer 104 is formed. As shown in FIG. 13A and FIG. 13B, when contacts 132 are defined in the upper layer 510, the patterning of the less than nominal pitch lines 128 results in lines 128 to be self-aligned to the nominal pitch contacts 132 and thus to the nominal pitch contact feature 134. As the second active layer 104 is formed as shown in FIG. 14 as discussed, below, formation of openings 130 in second active layer 104, plugs 136 will be formed adjacent to contacts 132 in alignment with the contacts 132 in the same manner that contact features 134 are formed adjacent to contacts 132. Such an arrangement may allow alignment of the nominal pitch contact feature 134 of the first active layer 102 with less than nominal pitch lines 128 of one or more active layers such as second active layer 104 as one or more decks are formed to be stacked in multiple decks. In general, contact features 134 may be nominal pitch, or nearly nominal pitch, and contacts 132 may be less than nominal pitch, for example half-pitch, quarter-pitch, and so on, and the scope of the claimed subject matter is not limited in this respect. Such an arrangement as shown in FIG. 13A and FIG. 13B may allow for scaling, pitch doubling, pitch quadrupling, and so on of the pitch of one set of contact lines with respect to another set of contact lines, and the scope of the claimed subject matter is not limited in this respect.

FIG. 14 shows the formation of the remainder of second active layer 104. For a dual layer/dual deck device, the openings 130 in second active layer 104 may be filled with plugs 136. Otherwise, the process of FIGS. 10A and 10B through FIG. 13A and FIG. 13B may be repeated for subsequent additional decks. FIG. 15 shows the etching of additional pathways 1510 through second active layer 104 for the upper deck contacts and through first active layer 102 for the lower deck contacts, common source contacts, and tub slots. FIG. 16 shows the formation of the plugs 136 of the second active layer 104 and first active layer 102. In some embodiments, plugs 136 may comprise polysilicon-metal plugs or metal plugs, although the scope of the claimed subject matter is not limited in this respect. Although the semiconductor device 100 utilizes silicon on insulator (SOI) for upper layer 510 in one embodiment, it should be noted that other materials may likewise be utilized and the scope of the claimed subject matter is not limited in this respect.

Methods for forming embodiments of the semiconductor device 100 such as a multi-deck memory array described herein comprise forming a first active layer 102 on a substrate. The memory array may be a volatile or a non-volatile memory array, such as a NAND memory array. The first active layer 102 comprises active devices such as transistors and related components including contact features such as one or more of a source, a drain, a gate, and a wordline. In embodiments, the first active layer 102 includes a dielectric top surface that is formed using one or more layers of a dielectric material such as an oxide or a high-K dielectric wherein the active devices in the first active layer 102 can be electrically isolated from overlying layers. The dielectric top surface of the first active layer 102 may be planarized, etched, or otherwise eroded in some embodiments. Further, the first active layer 102 may be planarized to provide a uniform top surface for the intermediate layer 114 and/or to reduce the active layer 102 to a desired thickness.

An intermediate layer 114 is deposited over the first active layer 102 wherein the intermediate layer 114 may be one or more layers of a dielectric material such as an oxide or a high-K dielectric, however the embodiment is not so limited. The intermediate layer 114 may be formed of or comprise alternate materials in other embodiments including semiconducting and conducting materials. An upper layer 510 is provided on the intermediate layer 114 without first forming an interconnect between the first active layer 102 and the upper layer 510. The upper layer 510 may be formed of a crystalline, poly-crystalline, or an amorphous material that is formed or positioned on the intermediate layer 114 and wherein the upper layer 510 is devoid of active devices. In one embodiment, the upper layer 510 is provided on the intermediate layer 114 using a wafer bonding process to deposit a silicon layer on the intermediate layer 114. Further, the upper layer 510 may be planarized to provide a uniform top surface of the upper layer 720 and/or to thin the upper layer 510 to a desired thickness.

An opening 130 is formed through the upper layer 510, the intermediate layer 114, and in some embodiments at least a portion of the first active layer 102, to expose a contact feature 134 of the first active layer 102. The opening 130 may be formed by etching or otherwise eroding a portion of the upper layer 510, the intermediate layer 114, and in some embodiments at least a portion of the first active layer 102 to reveal a top surface or at least a portion of the contact feature 134. A contact 132 is formed in the opening 130, wherein the contact 132 is formed on and directly adjacent to the contact feature 134 in the first active layer 102 and wherein the contact 132 substantially fills the opening 130 to the top surface of the upper layer 720. The contact 132 may be formed by depositing a contact forming layer 710 and optionally a seed and/or barrier layer in the opening 130 or by electrolessly forming the contact 132 from the bottom-up beginning at the contact feature 134 to substantially fill or fill at least a portion of the opening 130. In an embodiment, the contact 132 and the upper layer 510 comprise a common material such as silicon. Further, the contact 132 may be doped or undoped. Also, the contact 132 may be positioned to connect a bitline to a plurality of memory strings in the semiconductor device 100.

In embodiments, active devices are formed on the upper layer 510 to form a second active layer 104, wherein the active devices may comprise portions of the upper layer 510. For example, a bitline or wordline known to one skilled in the art may be examples of the active devices wherein the active devices are formed on the upper layer 510 but do not necessarily comprise portions of the upper layer 510. In another example, a source or drain known to one skilled in the art may be formed on the upper layer 510 wherein the source or drain comprises a portion of the upper layer 510.

Additional decks may be provided in the semiconductor device 100 by providing a second intermediate layer such as a second interlayer dielectric 118 on the second active layer 104. Openings 130 and/or pathways 1510 may be formed in the second interlayer dielectric 118 to expose one or more contacts 132 and one or more plugs 136 may be formed in the openings 130 and/or pathways 1510. Alternately, a second upper layer which may be formed using the same or different material than the upper layer 510 and similarly formed on the second interlayer dielectric 118, wherein the second upper layer is devoid of active devices. Further a second contact may be formed on and directly adjacent to the contact 132 positioned between the first active layer 102 and the second active layer, wherein the second contact connects the contact feature 134 in the first active layer 102 to a top surface of the second upper layer. Active devices may be formed on the second upper layer to form a third active layer on the second active layer, for example to connect a bitline in the first active layer to the third active layer.

Referring now to FIG. 17, a block diagram of an information handling system 1700 capable of utilizing three-dimensional stacked semiconductor device in accordance with one or more embodiments. Information handling system 1700 of FIG. 17 may utilize semiconductor device 100 as shown in and described herein. Although information handling system 1700 represents one example of several types of computing platforms, information handling system 1700 may include more or fewer elements and/or different arrangements of elements than shown in FIG. 17, and the scope of the claimed subject matter is not limited in these respects.

Information handling system 1700 may comprise one or more processors such as processor 1710 and/or processor 1712, which may comprise one or more processing cores. One or more of processor 1710 and/or processor 1712 may couple to one or more memories 1716 and/or 1718 via memory bridge 1714, which may be disposed external to processors 1710 and/or 1712, or alternatively at least partially disposed within one or more of processors 1710 and/or 1712. Memory 1716 and/or memory 1718 may comprise semiconductor device 100 as shown in and described herein, and may comprise various types of memory architectures including but not limited to flash memory, dynamic random access memory (DRAM), imagers, phase-change random access memory (PCRAM), resistive random access memory (RRAM), zero capacitor random access memory (ZRAM), one-time programmable random access memory (OTPRAM), and/or advanced static random access memory (SRAM), and so on, and the scope of the claimed subject matter is not limited in this respect. Memory bridge 1714 may couple to a graphics system 1720 to drive a display device (not shown) coupled to information handling system 1700.

Information handling system 1700 may further comprise input/output (I/O) bridge 1722 to couple to various types of I/O systems. I/O system 1724 may comprise, for example, a universal serial bus (USB) type system, an IEEE 1394 type system, or the like, to couple one or more peripheral devices to information handling system 1700. Bus system 1726 may comprise one or more bus systems such as a peripheral component interconnect (PCI) express type bus or the like, to connect one or more peripheral devices to information handling system 1700. A hard disk drive (HDD) controller system 1728 may couple one or more hard disk drives or the like to information handling system, for example Serial ATA type drives or the like, or alternatively a semiconductor based drive comprising flash memory, phase change, and/or chalcogenide type memory or the like. Switch 1730 may be utilized to couple one or more switched devices to I/O bridge 1722, for example Gigabit Ethernet type devices or the like. Furthermore, as shown in FIG. 17, information handling system 1700 may include a radio-frequency (RF) block 1732 comprising RF circuits and devices for wireless communication with other wireless communication devices and/or via wireless networks, although the scope of the claimed subject matter is not limited in this respect.

Although the claimed subject matter has been described with a certain degree of particularity, it should be recognized that elements thereof may be altered by persons skilled in the art without departing from the spirit and/or scope of claimed subject matter. It is believed that the subject matter pertaining to contact integration for three-dimensional stacking semiconductor devices and/or many of its attendant utilities will be understood by the forgoing description, and it will be apparent that various changes may be made in the form, construction and/or arrangement of the components thereof without departing from the scope and/or spirit of the claimed subject matter or without sacrificing all of its material advantages, the form herein before described being merely an explanatory embodiment thereof, and/or further without providing substantial change thereto. It is the intention of the claims to encompass and/or include such changes.

What is claimed is:

1. A method, comprising:
   forming a first active layer;
   depositing an intermediate layer on the first active layer;
   providing an upper layer on and directly adjacent to the intermediate layer without forming an interconnect between the first active layer and the upper layer;
   forming an opening through the upper layer and the intermediate layer to expose a contact feature of the first active layer, wherein the upper layer is devoid of active devices; and
   forming a contact in the opening, wherein the contact is formed on and directly adjacent to the contact feature in the first active layer and wherein the contact substantially fills the opening to a top surface of the upper layer;
   wherein the opening is formed using a full-pitch lithography process and the contact feature is formed using a half-pitch or smaller lithography process.

2. The method of claim 1, wherein the intermediate layer is a dielectric layer formed on the first active layer and wherein the first active layer comprises a dielectric top surface.

3. The method of claim 1, further comprising planarizing the first active layer prior to depositing the intermediate layer.

4. The method of claim 3, wherein the upper layer is formed on the intermediate layer using a wafer bonding process.

5. The method of claim 1, further comprising planarizing the upper layer.

6. The method of claim 1, further comprising forming active devices on the upper layer to form a second active layer, wherein the active devices comprise portions of the upper layer.

7. The method of claim 1, wherein the contact feature is one or more of a source, a drain, a gate, or a wordline.

8. An integrated circuit comprising a self-aligned contact to connect a contact feature in a first active layer to a second active layer, wherein the self-aligned contact is formed by:
   depositing an intermediate layer over the first active layer, providing an upper layer on and directly adjacent to the intermediate layer without forming an interconnect between the first active layer and the upper layer, forming an opening through the upper layer and the intermediate layer to expose the contact feature in the first active layer wherein the upper layer is devoid of active devices, and forming the self-aligned contact in the opening;
   wherein the opening is formed using a full-pitch lithography process and the contact feature is formed using a half-pitch or smaller lithography process.

9. The integrated circuit of claim 8, wherein the integrated circuit is a dual-deck NAND memory array.

10. The integrated circuit of claim 9, wherein the contact connects the bitline to a plurality of memory strings.

11. The integrated circuit of claim 10, further comprising a third active layer on the second active layer and wherein the bitline in the first active layer is connected to the third active layer.

12. The integrated circuit of claim 8, wherein the upper layer is formed using a wafer bonding process.

* * * * *